US008559654B2

(12) United States Patent
Houg

(10) Patent No.: US 8,559,654 B2
(45) Date of Patent: Oct. 15, 2013

(54) RANGE FINDING AUDIO SYSTEM

(75) Inventor: Todd C. Houg, St. Francis, MN (US)

(73) Assignee: Round Rock Research, LLC, Jersey City, NJ (US)

(*) Notice: Subject to any disclaimer, the term of this patent is extended or adjusted under 35 U.S.C. 154(b) by 295 days.

(21) Appl. No.: 12/873,476

(22) Filed: Sep. 1, 2010

(65) Prior Publication Data

US 2010/0329082 A1 Dec. 30, 2010

Related U.S. Application Data

(63) Continuation of application No. 11/063,396, filed on Feb. 22, 2005, now abandoned, which is a continuation of application No. 09/306,954, filed on May 7, 1999, now Pat. No. 6,859,417.

(51) Int. Cl.
*H04R 1/40* (2006.01)
*H03G 3/00* (2006.01)

(52) U.S. Cl.
USPC .......................................... 381/97; 381/107

(58) Field of Classification Search
USPC .......... 381/103–105, 56, 58, 59, 97, 107, 108
See application file for complete search history.

(56) References Cited

U.S. PATENT DOCUMENTS 4,586,195 A 4/1986 DeGeorge et al.
5,129,004 A 7/1992 Imai et al.
5,255,326 A 10/1993 Stevenson
5,386,478 A * 1/1995 Plunkett .......................... 381/103
5,499,294 A 3/1996 Friedman
5,666,424 A * 9/1997 Fosgate et al. ................ 381/104

FOREIGN PATENT DOCUMENTS

JP 10-126900 A 5/1998

* cited by examiner

*Primary Examiner* — Ping Lee
(74) *Attorney, Agent, or Firm* — Lerner, David, Littenberg, Krumholz & Mentlik, LLP

(57) ABSTRACT

A range finding audio system automatically modifies the audio output of an audio source based on the distance of a listener from the speakers. A speaker in an audio system may include a range device coupled with a controller. The range device may utilize infrared, laser, or acoustic technology to determine the distance between the speaker and the listener. The controller may transfer distance information to an audio interface of a processor unit. The audio lo interface may include a positioning routine to modify the audio output according to the distance from the speaker to the listener. Alternatively, the controller may perform the functions ascribed to the positioning routine making the necessary modifications to the audio output based on the distance information.

13 Claims, 2 Drawing Sheets

RANGE FINDING AUDIO SYSTEM

CROSS-REFERENCE TO RELATED APPLICATIONS

The present application is a continuation of co-pending U.S. patent application Ser. No. 11/063,396, filed Feb. 22, 2005, which was abandoned as of Sep. 30, 2010, which application is a continuation of U.S. patent application Ser. No. 09/306,954, filed May 7, 1999, now U.S. Pat. No. 6,859,417, the disclosures of which are hereby incorporated by reference.

BACKGROUND OF THE INVENTION

The invention relates generally to audio systems, and more particularly to audio systems with range finding devices.

In the past few years, audio system quality has improved rapidly due to several technological advancements. New media such as compact discs allow for higher quality audio recordings. The designs of speakers have also been modified to enhance both sound clarity and quality. Additionally, advances in digital technology have made dramatic improvements in audio quality. Today, many computer users emphasize audio technology as an important factor in purchasing a computer system. Therefore, computer companies have swiftly incorporated some advances in audio technology into their computer systems. Advances in audio technology such as three dimensional (3D) audio have also is greatly affected the computer game industry. Three dimensional audio systems construct audio output signals that enable the listener to perceive a three dimensional sound field around them. By replicating the audio cues that people use to determine sound location and intensity, the listener may hear audio signals that appear to be generated by sound sources located at different places in the three dimensional sound field.

These advanced audio technologies are very effective if the listener is stationary at the audio focal point of the system. An audio system may have an audio focal point at a location where the balance of the sound from each of the speakers may be approximately equal. However, if a listener moves away from the audio focal point, the listener's perception of the sound quality may degrade. To overcome this, a user may manually adjust the balance of the audio system's speakers or manually adjust the location of the speakers. Actions such as these may interrupt a listener during the course of using an audio system or computer system.

Thus, it would be beneficial to provide a method for automatically modifying the audio output of an audio system based on a change in position of the listener.

BRIEF SUMMARY OF THE INVENTION

The invention provides an audio system including a range device coupled to a plurality of speakers. The range device may aid in determining the distance to an object. The audio system may also include a positioning routine to modify the audio output based on the distance information. In one embodiment, the invention provides a method to automatically modify the audio output signal upon a detected change in position of an object. In another embodiment, the invention may include receiving indications of the distances from speakers to an object and, based on the distance indications, modify the audio output.

DETAILED DESCRIPTION

Techniques (including methods and devices) are described to construct an audio system that utilizes a range device incorporated in a speaker to automatically adjust the audio output signals upon the detected movement of an object, e.g., the listener. The following embodiments of this invention are illustrative only and are not to be considered limiting in any respect.

Figure 1:
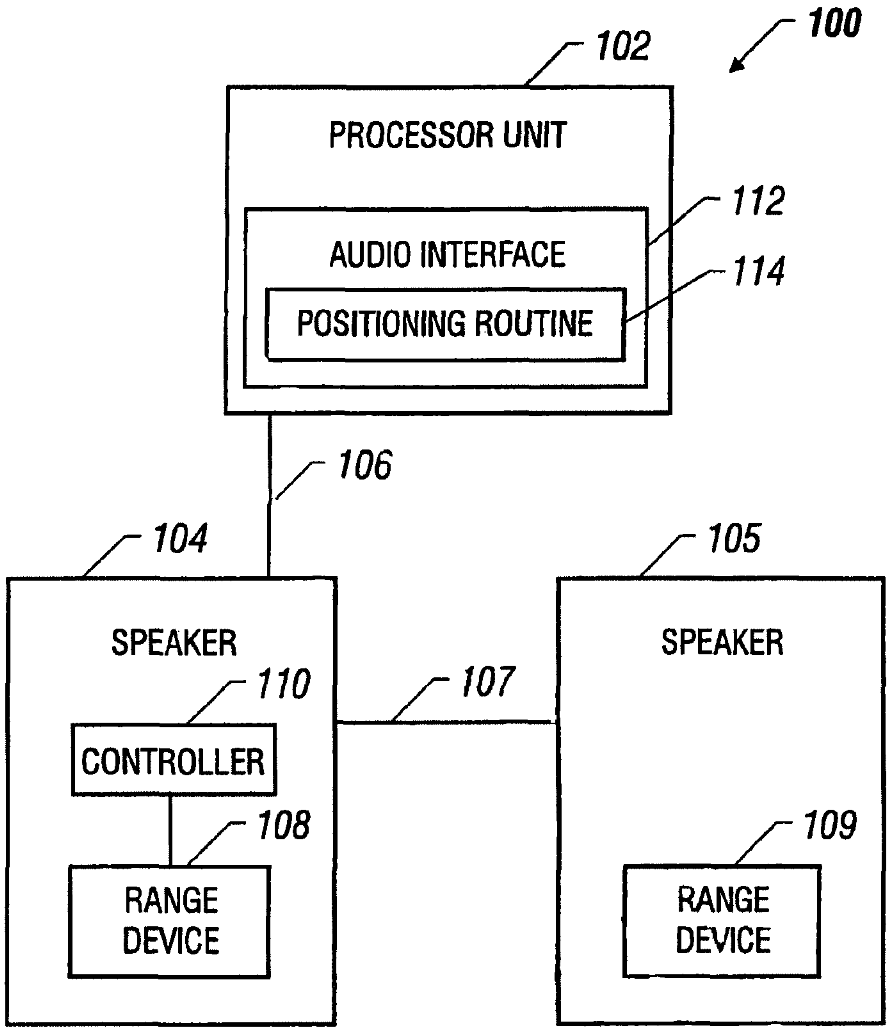
FIG. 1 shows an illustrative audio system with a range finding speaker system.

Referring to FIG. 1, one embodiment of an illustrative audio system 100 may include a processor unit 102. For example, a processor unit 102 may be the central processing unit of a computer system. Alternatively, the processor unit 102 may be a microprocessor or microcontroller incorporated in a stereo system. In some embodiments, the audio system 100 may include two speakers. In other embodiments, the audio system 100 may include a plurality of speakers, as in a surround sound system. The processor unit 102 may include an audio interface 112 that sends audio output signals to speakers 104 and 105. The audio output signals may be sent to speaker 104 via communication link 106 and then to speaker 105 via communication link 107. The communication links 106 and 107 may utilize cable or wireless technologies such as radio frequency (RF) or infrared (IR).

Speaker 104 may include a range device 108 coupled with a controller 110. A range device 108 may aid in determining the distance from the listener to the speaker 104 at a particular time. Another speaker 105 may also include a range device 109 to determine the distance from speaker 105 to the listener. A range device 109 in speaker 105 may then transfer the distance data to the controller 110 in the speaker 104 via the communication link 107. The distance data from both speakers 104 and 105 may be transferred to the audio interface 112 of the processor unit 102 via the communication link 106. An audio interface 112 may include a positioning routine 114 which may modify the audio output to speakers 104 and 105 based on the distance information. The positioning routine 114 may adjust the balance of the audio output by attenuating the power output to the speakers. In accordance with another embodiment, audio system 100 may be a three dimensional (3D) audio system which simulates a three dimensional field of sound around the listener. A 3D audio system may include sound sources arranged in the three dimensional field of sound such that the listener perceives the sounds at a precise time and volume level. Each sound source may be represented by a separate component of the audio output signal. In order to preserve the timing and intensity of the 3D audio output, the audio system 100 may modify the audio output signals based upon a detected change in position of the listener. In this embodiment, the positioning routine 114 may modify the timing of audio signals to speakers 104 and 105 to maintain a 3D audio field where the listener is kept at the audio focal point.

Figure 2:
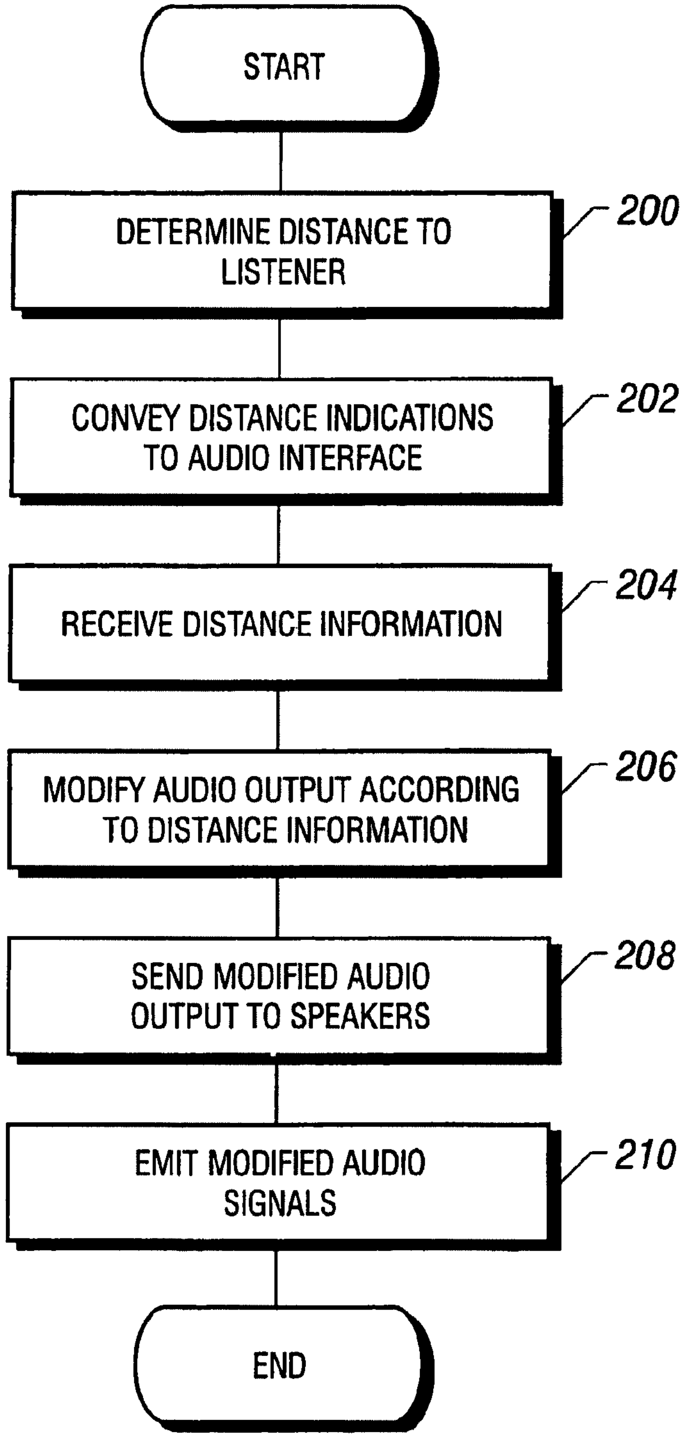
FIG. 2 shows a flow diagram for a range finding speaker system.

According to some embodiments, range devices 108 and 109 may be any type of device capable of determining the distance to an object. Illustrative range devices may include infrared, laser, or acoustic technology to provide indications of the distance to an object. Referring to FIG. 2, in one embodiment the range device 108 of a speaker 104 may determine the distance to the nearest object, e.g., the listener, within the line of the audio output, as in block 200. Additionally, range device 109 of speaker 105 may determine the distance between speaker 105 and the listener. Then, the range devices 108 and 109 may convey indications of the distance information to the audio interface 112 of the processor unit 102 via communication links 106 and 107, as shown in block 202. At block 204, the positioning routine 114 receives the distance information. The positioning routine 114 may modify an audio output signal in accordance with the distance of the listener from the speakers 104 and 105, as shown in block 206. The audio balance of the system may be modified to maintain the balance perceived by the listener at their previous position. In another embodiment, the timing of the audio output signals may be modified based on the distance information to maintain a three dimensional audio field where the listener is kept at the audio focal point. Next, at block 208, the audio interface 112 may transmit the modified audio signals to the speakers 104 and 105 via the communication links 106 and 107. The speakers 104 and 105 may then emit the modified audio signals as sounds for the listener to hear, as shown in block 210.

In accordance with one embodiment of the invention, an audio interface 112 may generate an interrupt at a regular interval to provide the positioning routine 114 with updated distance information. Alternatively, an audio interface 112 may generate an interrupt when the position of the listener changes more than a specified amount. In accordance with another embodiment of the invention, the audio interface 114 may include registers for storing the distance information from the range devices 108 and 109. The positioning routine 114 may poll the registers in the audio interface 112 for changes in the distance information.

In another embodiment, after range devices 108 and 109 determine the distances from the speakers to the listener, the controller 110 may modify the audio output signals. Instead of transferring the distance information to the audio interface 112, the controller 110 may adjust the power or the three dimensional balance of the audio output signals. In one embodiment, the controller 110 may modify the audio output signals each time new distance information is obtained by the range devices 108 and 109. In accordance with another embodiment, the controller 110 may modify the audio output signals at a regular interval (e.g., once every two seconds) based on the distance information.

Various changes in the materials, components, circuit elements, as well as in the details of the illustrated operational method are possible without departing from the scope of the claims. For instance, ads in accordance with FIG. 2 may be performed by a programmable control device executing instructions organized into a program module (e.g., positioning routine 114). A programmable control device may be a single computer processor (e.g., processor unit 102), a plurality—of computer processors coupled by a communications link, a microcontroller, a digital signal processor, or a custom designed state machine (e.g., controller 110). Custom designed state machines may be embodied in a hardware device such as a printed circuit board comprising discrete logic, integrated circuits, specially designed application specific integrated circuits (ASICS), or field programmable gate array devices. Storage devices suitable for tangibly embodying program instructions include all forms of non-volatile memory including, but not limited to: semiconductor memory devices such as EPROM, EEPROM, and flash devices; magnetic disks (fixed, floppy, and removable); other magnetic media such as tape; and optical media such as CD-ROM disks.

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

The invention claimed is:

1. A system comprising:

a plurality of speakers;

a plurality of range devices associated with respective speakers, each range device adapted to generate an indication representing a distance of the respective speaker to a listener; and a module operatively coupled to the plurality of range devices, the module comprising logic that polls a register operatively coupled to the module, wherein the register stores distance information from the plurality of range devices, and wherein the logic polls the register for differences in the distance information from the range devices, wherein, the module modifies a timing of an audio signal transmitted to at least one of the plurality of speakers based on the a determined difference between the distance information stored in the register and the signals that the module receives from the range devices.

2. The system of claim 1, wherein the plurality of speakers comprises at least two speakers.

3. The system of claim 1, wherein the module comprises a central processing unit of a computer.

4. The system of claim 1, wherein the module comprises a microprocessor in a stereo system.

5. The system of claim 1, wherein the range devices comprise infrared range devices.

6. The system of claim 1, wherein the range devices comprise acoustic range devices.

7. The system of claim 1, wherein the range devices comprise laser range devices.

8. A method to adjust audio output at plural speakers, comprising:

receiving signals representing distances of respective speakers to a listener;

storing the distance information;

receiving additional signals representing distances of the respective speakers to a listener;

comparing the distance information from the additional signals with the stored distance information;

modifying timings of audio output signals based on the comparison; and sending the audio output signals having the modified timings to respective speakers.

9. The method of claim 8, further comprising modifying a power output of at least one of the audio output signals in response to the signals representing distances.

10. The method of claim 8, further comprising modifying an intensity of at least one of the audio output signals in response to the signals representing distances.

11. An apparatus comprising:

a processor;

a routine executable on the processor to:

receive indications of distances from respective output speakers to a listener;

poll a register in the processor for prior distance information; and modify a timing of at least one of audio output signals provided to respective output speakers based on the difference between the prior distance information and the received indications of distances.

12. The apparatus of claim 11, the routine executable to further: modify an intensity of at least one of the audio output signals provided to the output speakers based on the indications of distances.

13. The apparatus of claim 12, wherein the routine is executable to receive the indications of distances from range devices associated with respective output speakers.

* * * * *